United States Patent [19]
Toumazou et al.

[11] Patent Number: 5,682,122
[45] Date of Patent: Oct. 28, 1997

[54] OPTO-ELECTRONIC TRANSCONDUCTORS

[75] Inventors: Christofer Toumazou, Oxford; Tongtod Vanisri, London, both of United Kingdom

[73] Assignee: Imperial College of Science, Technology & Medicine, London, England

[21] Appl. No.: 513,832
[22] PCT Filed: Feb. 25, 1994
[86] PCT No.: PCT/GB94/00386
    § 371 Date: Aug. 24, 1995
    § 102(e) Date: Aug. 24, 1995
[87] PCT Pub. No.: WO94/19867
    PCT Pub. Date: Sep. 1, 1994

[30] Foreign Application Priority Data

Feb. 25, 1993 [GB] United Kingdom .......... 9303846

[51] Int. Cl.⁶ .............. H03F 3/08; H03F 3/191
[52] U.S. Cl. .......................... 330/308; 330/303
[58] Field of Search ............ 250/214 A; 330/4.9, 330/59, 253, 277, 308, 303; 333/213, 214

[56] References Cited

U.S. PATENT DOCUMENTS

| | | | |
|---|---|---|---|
| 4,295,225 | 10/1981 | Pan | 330/277 X |
| 5,021,361 | 6/1991 | Kinoshita et al. | 372/50 X |
| 5,089,787 | 2/1992 | Wang et al. | 330/4.9 |
| 5,343,177 | 8/1994 | Williams | 333/214 X |

*Primary Examiner*—Steven Mottola
*Attorney, Agent, or Firm*—Fay, Sharpe, Beall, Fagan, Minnich & McKee

[57] ABSTRACT

A transconductance device particularly suitable for use as a high frequency active filter has an input stage including at least one field effect transistor ($M_1$) arranged to drive a laser diode ($LD_1$) and an output stage including at least one photodiode ($PD_1$) optically coupled to the laser diode. The output stage is preferably provided with a high impedance bias current supply circuit. In an alternative arrangement particularly useful as an operational amplifier, a differential input stage includes a pair of laser diodes ($LD_1$ and $LD_2$) optically coupled to respective photodiodes ($PD_1$ and $PD_2$) connected in series, the output being taken from the junction of the two photodiodes.

18 Claims, 4 Drawing Sheets

Schematic diagram of opto-electronic transconductor

Schematic diagram of opto-electronic transconductor

Transconductor model

Schematic diagram of Gm-C active inductor

Equivalent circuit of active inductor

Schematic diagram of opto-electronic active resonator

Experimental frequency response of active resonator at $f_0 = 10$ MHz, $Q = 500$ Experimental frequency response of active resonator at $f_0 = 20$ MHz, $Q = 300$

OPTO-ELECTRONIC TRANSCONDUCTORS

The present invention relates to transconductance devices employing optical elements, particularly, although not exclusively, for use in high quality, high frequency active filter circuits.

Classical high frequency RLC passive filters can be synthesised by integrated transconductance-C approaches. However, in doing so the filter characteristics are now totally determined by those of the Operational Transconductance Amplifiers (OTAs) used, both in terms of frequency performance and filter quality factor. However, the low sensitivity properties of the passive equivalent are still preserved.

FET technology has been the most popular for realising these integrated filters because of its natural transconductor features, although bipolar technology has been used successfully for 200 MHz integrated filters (1). These filters are usually realised by integrator loops comprising transconductors driving a grounded load capacitance. Integrator time constants are determined by $C/G_m$ where $G_m$ is the transconductance gain of the OTA, and can be tuned via $G_m$ tuning. The filter Quality factor Q is determined by the unloaded DC gain of the OTA, $G_m/G_o$, where $G_o$ is transconductor output conductance. Assuming very high frequency poles for the transconductor then for ideally infinite unloaded filter Q the integrators must have a phase of ninety degrees, requiring infinite DC gain, hence zero $G_o$. For high frequency filtering the OTAs must be kept as simple as possible.

Unfortunately, for high frequency filter design employing FET technology the output conductance of short channel MOSFETS and GaAs MESFETs is undesirable high (2) even at relatively low frequency and so high Q filters are very difficult to realise. The conflict usually arises between suitable DC gain magnitude and circuit complexity leading to high frequency phase shift, both of which effect filter Q (2). Cascoding (3) is a well-known technique to improve the output resistance of the OTA, but due to low intrinsic voltage gain ($g_m/g_o$) of the short channel MOSFET (4) and the GaAs MESFET, single cascode (3) techniques can only achieve OTA voltage gain figures of the order of a few hundred. Double cascode (5) and regulated cascode (4,6,7) techniques can achieve 60 dB gain figures but at the expense of increased circuit complexity. Furthermore, the lack of P-type devices in GaAs MESFET technology further complicates the design, in particular the difficulty in realising a good negative current-source (3,8) which is essential to most transconductor topologies.

The emergence of fibre-optic communications has led to the development of high performance laser diodes and p-i-n photodiodes at very high speed. P-i-n photodiodes convert a light signal into an electrical current which acts as a current source in parallel with very high output resistance and capacitance. The quantum efficiency of p-i-n photodiodes depends on the material and wavelength, fortunately the quantum efficiency of Si and GaAs can be as high as 80% or more (9). Laser diodes convert electrical current into laser light, the ac efficiency is quite high (9) (10–50%) and input resistance is very low.

Accordingly, a first aspect of the present invention provides a transconductance device comprising an input stage including a field effect transistor arranged to drive a laser diode, and an output stage comprising a first photodiode optically coupled to the laser diode, the said photodiode being provided with a high impedance bias current supply circuit. Such a device is referred to below as "a transconductance device of the type herein described".

Preferably, the said high impedance bias current supply circuit comprises a second photodiode connected in series with the said first photodiode and optically coupled to a further light source having a constant output.

Preferably the said further light source comprises a second laser diode, or an LED, driven by a constant current source.

According to a second aspect of the present invention there is provided an opto-electronic inductor comprising two back-to-back transconductors at least one being of the type herein described; one of the said transconductors being arranged in an inverting configuration and being connected as an integrator with a grounded load while the other is non-inverting.

In one embodiment of the invention, the said inverting transconductor is a conventional FET transistor device while the non-inverting transconductor is an opto-electronic device of the type herein described.

The invention also extends to high frequency high Q filters incorporating these opto-electronic techniques. Optical devices can be combined with FET technology to significantly improve OTA output resistance without additional circuit complexity and the expense of additional high frequency phase.

Some embodiments of the invention will now be described by way of example with reference to the accompanying drawings in which.

OPTO-ELECTRIC TRANSCONDUCTOR

Figure 1:
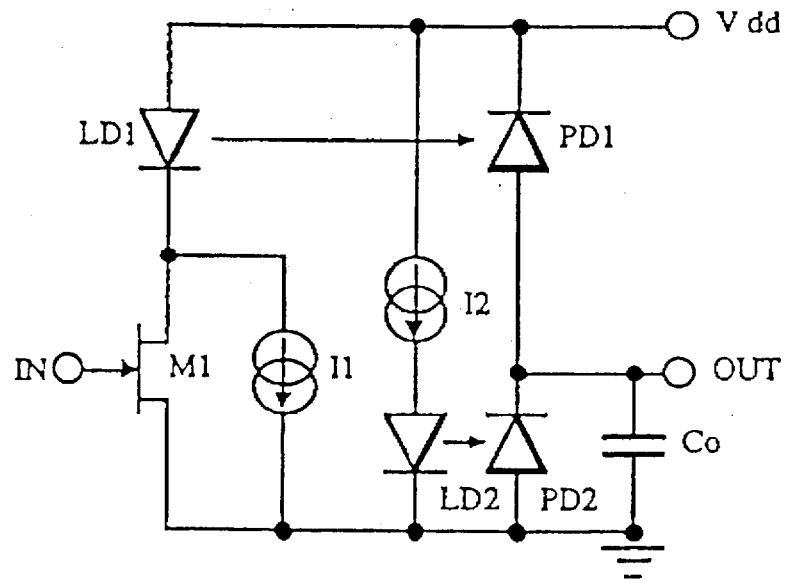
FIG. 1 is an opto-electronic transconductor according to the invention.

FIG. 1 shows an opto-electronic transconductor using N-Channel Depletion-Mode FETs which can either be Silicon JFETs or GaAs MESFETs. $M_1$ is a common source connection which has fairly low output resistance, due to non-cascoding. The drain current of $M_1$ is fed to the laser diode $LD_1$. $I_1$ is the bias current for $LD_1$. The output of the laser diode is optically coupled to a p-i-n photo diode $PD_1$. Photodiode $PD_2$ and laser diode $LD_2$ (this laser diode can be replaced with a LED) serve as the bias current for photodiode $PD_1$. This obviates the need for an active transistor current source connected to the output. The net output resistance of the transconductor is thus the output resistance of the photodiode which is very high and this output resistance is frequency independent. The $G_m$ of the transconductor can also be increased by the $I_{DSS}$ of $M_1$ without affecting transconductor output resistance. Under these conditions, we can increase the voltage gain of the transconductor by increasing the $g_m$ (increase the gate width of $M_1$) and keep the output resistance of the transconductor constant. The transfer function of this transconductor is given by $$g_m = g_{m1} \eta_{LD} \eta_{PD} \tag{1}$$

where $g_{m1}$=transconductance of FET $M_1$ $\eta_{LD}$=conversion efficiency of laser diode $\eta_{PD}$=conversion efficiency of photodiode The output resistance is determined by the photodiode dark current and is usually very high (>1MΩ[9]).

Integrator Modelling

Figure 2:
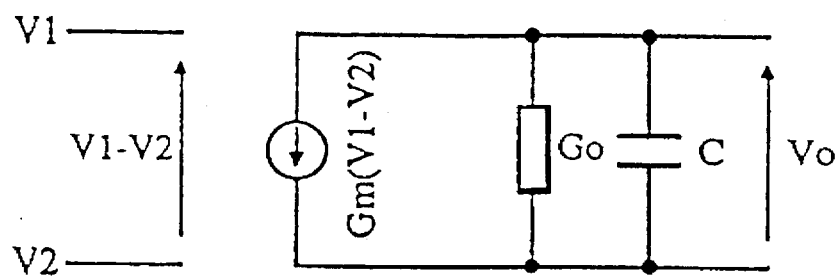
FIG. 2 is a small signal model of a transconductor integrator.

The model of an integrator realised by connecting a capacitor to the output of a transconductor is shown in FIG. 2. $G_m$ and $G_o$ are the transconductance and output conductance, respectively, of the transconductor. The low frequency pole due to $G_o$ at $\omega_1=G_o/C$ causes a reduction of the ideal 0 90° phase shift. It is also assumed in [2] that phase shift caused by high frequency roll-off within the transconductor is a single pole for $G_m$, i.e. $G_m=g_{mo}/(1+s/\omega 2)$. In [2] the possibility of cancellation of two sources of phase error at a high frequency was considered and could be achieved by tuning the output resistance of the transconductor. The phase error due to the $f_t$ of active devices can be improved by compensation techniques [10, 11].

Active Inductors

Figure 3:
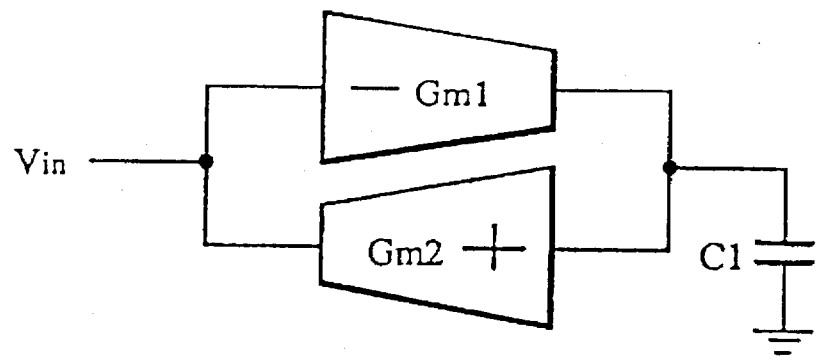
FIG. 3 is a schematic diagram of a Gm-c active inductor.
Figure 4:
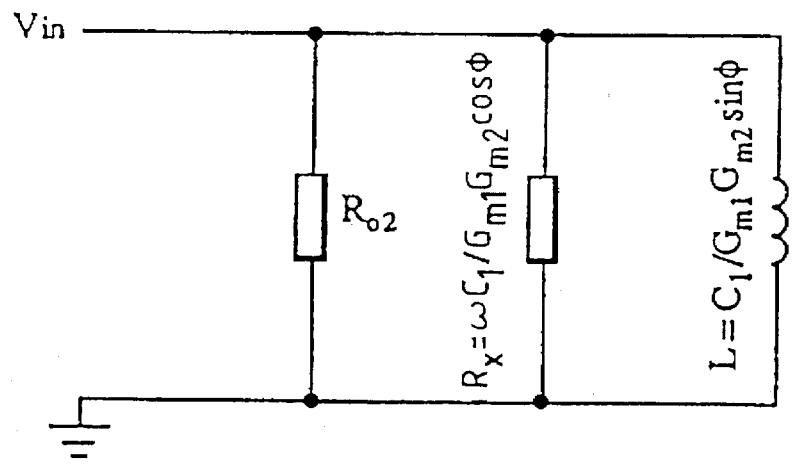
FIG. 4 is an equivalent circuit of the device of FIG. 3.

The gm-C active inductor [2] is a well known circuit topology comprising two back to back transconductors one inverting and connected as an integrator with grounded load and the other one non-inverting as shown in FIG. 3. Its equivalent circuit is shown in FIG. 4 where the inductance value is ideally given by $L=C_1/G_{m1}G_{m2}$, and where $R_{o2}$ is the output resistance of transconductor 2 and $R_x$ is the resistance caused by integrator phase error from $-90°$ $R_x$ can be positive or negative when the phase shift is less than $-90°$ or more than $-90°$ respectively. The Q factor of inductor is given by $$Q = R_o/\omega L \quad (2)$$

where $R_o = R_{o2}/R_x$
$R_x = \omega C_1/g_{m1}g_{m2}\cos\phi$
$\phi = -\tan^{-1}(\omega/\omega_2) - \tan^{-1}(R_{o1}/\omega C_1)$
$L = C_1/g_{m1}g_{m2}\sin\phi$ From the above the Q factor of the inductor is limited by the non-ideal effects of the transconductors such as finite output resistance and high frequency phase error. Even if we can tune the phase shift $\phi$ of the integrator close to its ideal value of $-90°$ at a desired unity gain frequency, we still need high output resistance $R_{o2}$ of transconductor 2 to achieve a high Q inductor as indicated in the model of FIG. 4.

Opto-Electronic Inductor

Figure 5:
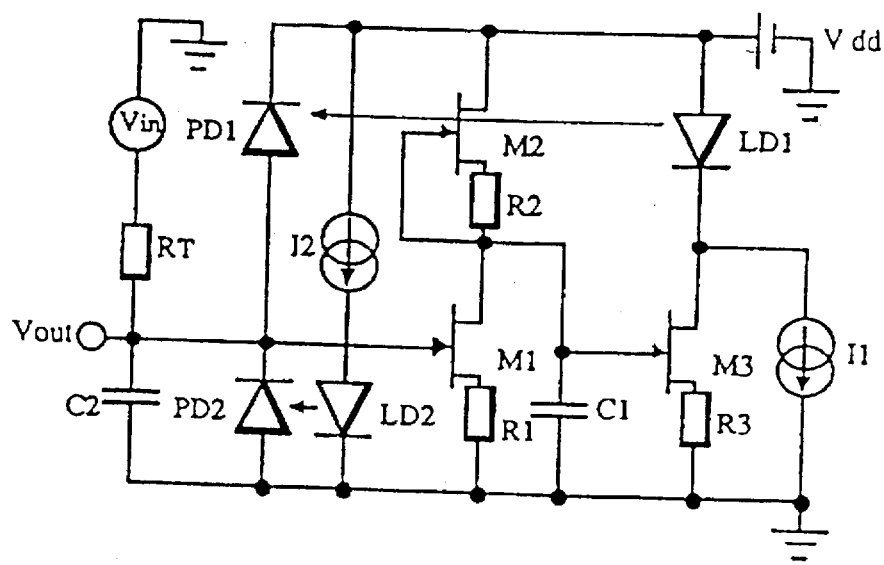
FIG. 5 is a schematic diagram of an opto-electronic active resonator (filter)

The opto-electronic inductor can help to resolve this problem. Rather than using two identical opto-electronic transconductors to replace each in FIG. 3, and thus two optical links, the arrangement can be simplified by employing a conventional inverting transconductor for $G_{m1}$ and an opto-electronic transconductor for $G_{m2}$, thus requiring only one optical link. The resulting opto-electronic inductor is shown in FIG. 5. It comprises a very simple low gain common-source inverting transconductor ($M_1, M_2$) for $G_{M1}$ with emitter degeneration resistors $R_1$ and $R_2$ to improve linearity and increase output resistance. $G_{M2}$ comprises the opto-electronic transconductor of FIG. 1 with degeneration resistor $R_3$ which improves the linearity of $G_{M2}$, $I_1$ and $I_2$ are bias currents for laser diode $LD_1$ and $LD_2$ respectively. $PD_2$ and $LD_2$ are used to provide the bias current for $PD_1$. From equation 2 it can be seen that we can achieve a high Q inductor by maximising both $R_{o2}$ and $R_x$. The advantage of the opto-electronic transconductor opposed to having a second classical transconductor is firstly that $R_{o2}$ is very large as required, and secondly $R_{o2}$ is independent of $G_{m2}$, such that the inductor value can be independently tuned by $G_{M2}$ (via $R_3$). Thus $R_x$ causes the main phase error contributions at both low and high frequency. At low frequencies the first two terms in the expression for $\phi$ are negligible and so to reduce the remaining phase error term ($\tan^{-1}R_{o1}/C_1$) we can increase $C_1$. However since this will also reduce the inductor value we can compensate by increasing $G_{M2}$ (note again that this is achieved without affecting $R_{o2}$). At high frequency assuming that the actual device $f_t$ are very high, cancellation of phase error due to $R_{o1}$ tuning is possible [2] in this case (via $R_1$).

Experimental Evaluation of High Q Resonator

In order to verify the performance of the opto-electronic inductor we connected it as a high Q resonator/bandpass filter by connecting a capacitor in parallel with the inductor and terminating with a very large resistor, not to load the Q, as shown in FIG. 5. A discrete implementation of the circuit of FIG. 5. was initially constructed to demonstrate the technique. Because of the discrete nature of this demonstrator circuit we decided to use U 310 silicon JFETs with have nominal $g_m=20$ mS, $C_{gs}=5$ pF, $I_{DSS}=40$ mA, $-6V$ threshold voltage. This JFET was deliberately chosen because of its low DC gain which was about 20. ML4413N laser and PIN diode optical pairs were used which have an output power of about 2 mW, 850 nm wavelength, threshold current of 40 mA. The p-i-n photodiode has a parasitic capacitance of 4 pF (built in with laser diode for output power monitoring). The measured total ac current transfer from the input of laser diode to the photodiode output was only 10%. This coupling efficiency is quite low because the photodiode is coupling the laser light from the rear end rather than the front end which has higher light power. It is difficult to couple all the light signal from the front end because of the packaging and wave front distribution. The measured output resistance of the photodiode was about 10 MΩ at 1 mW bias light power which corresponds to 300 μA bias current. The measure open loop DC voltage gains of transconductor ($M_1, M_2$) and opto-electronic transconductor are 20 and 5000 respectively.

Figure 6:
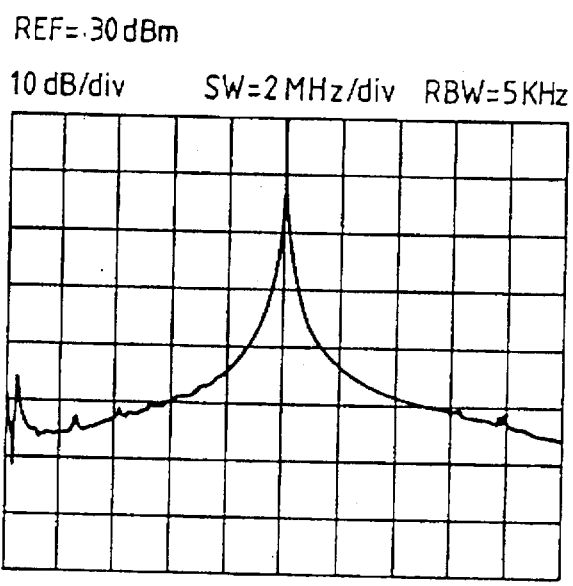
FIGS. 6 and 7 are frequency response diagrams of the circuit of FIG. 5.
Figure 7:
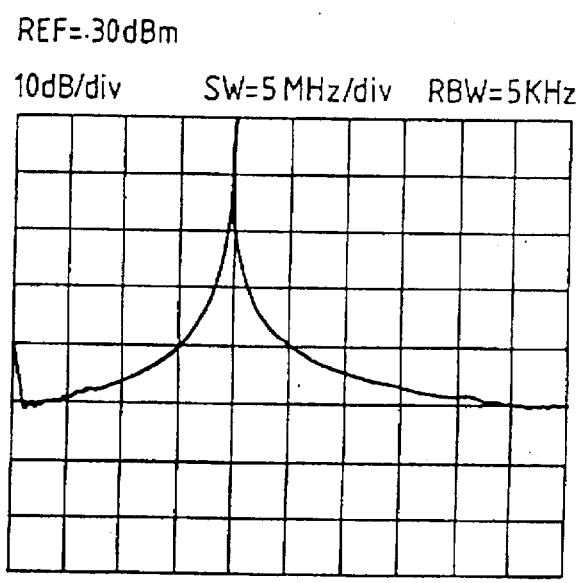

The frequency response of the resonator of FIG. 5 is shown in FIG. 6. The centre frequency is 10 MHz and the Q factor is 500. FIG. 7 also show the resonator tuned at 20 MHz and a Q factor now fo 300. It is also notable that the product $f_oQ$ of the filter is more than an order of magnitude higher than the $f_t$ of the JFET which is 500 MHz. Classical filters have $f_oQ$ well below the $f_t$ of the technology.

Figure 8:
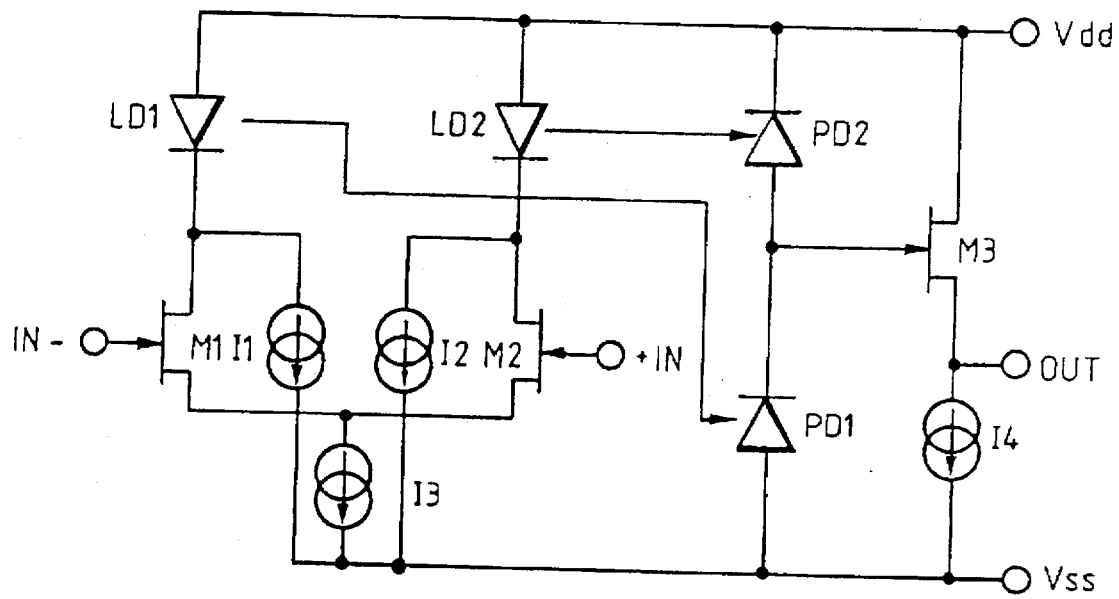
FIG. 8 is a schematic diagram of a further type of opto-electronic transconductor forming an operational amplifier.

The schematic diagram of a proposed opto-electronic operational amplifier is shown in FIG. 8. $M_1$ and $M_2$ form the differential input stage. The output currents of $M_1$ and $M_2$ are fed to the laser diodes $LD_1$ and $_2$ respectively. The light outputs of the laser diodes $LD_1$ and $LD_2$ are coupled to the p-i-n photodiodes $PD_1$ and $PD_2$ respectively. $M_3$ is the output buffer. $I_3$ is the differential pair bias current. $I_1$ and $I_2$ are the bias currents for the laser diodes. $I_4$ is the bias current for $M_3$. The open loop gain of the amplifier is given by $$A_{VO} = g_m[R_{OPD1}//R_{OPD2}] \quad (8)$$

The dominant pole is given by $$\tau_1 = (R_{OPD1}//R_{OPD2})(C_{PD1} + C_{PD2} = C_{gd3}) \quad (9)$$

References

[1] A. Wysznski, R. Schaumann, S. Szczepanski and P. V. Halen, "Design of a 2.7 GHz Linear OTA in Bipolar Transistor-Array Technology with Lateral PNPs", Proc IEEE Int. Symp. Circ. Syst., pp. 2844–2847, May 1992

[2] C. Toumazou and D. G. Haigh, "Integrated Microwave Continuous-Time Active Filters Fully Tunable GaAs Transconductors", Proc. IEEE Int. Symp. Circ. Syst., pp. 1765–1768 May 1991

[3] P. Wu and R. Schaumann, "A High Frequency GaAs Transconductance Circuit and its Applications", Proc. IEEE Int. Symp. Circ. Syst., pp. 3081–3084, May 1990.

[4] E. Sackinger and W. Guggenbuhl, "A High-Swing, High-Impedance MOS Cascode Circuit", IEEE J. Solid-State Circuits, vol. SC-25, no. 1, pp. 289–298, February 1990.

[5] C. Toumazou, F. J. Lidgey and D. G. Haigh, Editors "Analogue IC Design: the Current-Mode Approach", Peter Peregrinus Ltd, London, 1990.

[6] K. Bult and G. Geelan, "A Fast-Setting CMOS Op-Amp for SC Circuits with 90-dB DC Gain", IEEE J. Solid-State Circuits, vol, SC-25, no. 6, pp. 1379–1384, December 1990.

[7] H. C. Yang and D. J. Allstot, "An Active-Feedback Cascode Current Source", IEEE Trans. Circuit Syst., Vol. CAS-37, no. 5, pp. 644–646, May 1990.

[8] P. Visocchi, J. Talor, A. Betts and D. G. Haigh, "A Novel Tunable GaAs MESFET OTA-C Integrator Suitable for High Precision Filtering Applications", IEE Electron Lett., Vol 27 no. 18, pp. 1671–1673, 29 August 1991.

[9] Chinlon Lin, Editor, "Optoelectronic Technology and Lightwave Communication Systems", Van Nostrand Reinhold Ltd., New York, 1989.

[10] J. R. Angulo, E. S. Sinencio and M. Howe, "High Selectivity, High Frequency Continuous-Time Filters Using Multiple Output OTAs", Proc. IEEE Int. Symp. Circ. Syst., pp. 1351–1354, May 1991.

[11] J. R. Angulo, E. S. Sinencio, "Active Compensation of Operational Transconductance Amplifiers Using Partial Positive Feedback", IEEE J. Solid-State Circuits, vol. SC-25, no. 4, pp. 1024–1028, August 1990.

We claim:

1. A transconductance device comprising:
   an input stage including at least one field effect transistor ($M_1$) arranged to drive a laser diode ($LD_1$); and,
   an output stage comprising a first photodiode ($PD_1$) optically coupled to the laser diode, the output stage having a high impedance bias current supply circuit which comprises a second photodiode ($PD_2$) connected in series with the first photodiode ($PD_1$) and optically coupled to a further light source having a constant output.

2. The transconductance device according to claim 1, wherein the further light source comprises a second laser diode ($LD_2$) driven by a constant current source.

3. A transconductance device comprising:
   an input stage including a differential amplifier having a pair of field effect input transistors ($M_1$, $M_2$) each driving a laser diode ($LD_1$, $LD_2$); and,
   an output stage comprising a pair of photodiodes ($PD_1$, $PD_2$) connected in series, each photodiode being optically coupled to one of the laser diodes ($LD_1$, $LD_2$), an output signal being taken from a junction of said photodiodes.

4. The transconductance device according to claim 3, further comprising an output buffer stage ($M_3$) connected to said junction of the photodiodes.

5. The transconductance device according to claim 3, further comprising an output buffer stage ($M_3$) connected to said junction of the photodiodes, wherein the output buffer stage comprises a field effect transistor.

6. An opto-electronic inductor comprising:
   a first non-inverting transconductor; and,
   a second inverting transconductor connected as an integrator with a grounded load and arranged in a back-to-back relationship with said first non-inverting transconductor, at least one of the first transconductor and the second transconductor including a transconductance device comprising:
   an input stage including at least one field effect transistor ($M_1$) arranged to drive a laser diode ($D_1$), and
   an output stage comprising a first photodiode ($PD_1$) optically coupled to the laser diode, the output stage having a high impedance bias current supply circuit which comprises a second photodiode ($PD_2$) connected in series with the first photodiode ($PD_1$) and optically coupled to a further light source having a constant output.

7. The opto-electronic inductor according to claim 6, wherein at least one of the first transconductor and the second transconductor is an FET transistor.

8. The transconductance device according to claim 1, wherein the transconductance device is a high frequency filter.

9. A transconductance device comprising:
   an input stage including at least one field effect transistor arranged for driving a laser diode; and,
   an output stage including a first photodiode optically coupled to the laser diode, the output stage having a high impedance bias current supply circuit including a second photodiode.

10. The transconductance device according to claim 9, wherein the second photodiode is connected in series with the first photodiode and optically coupled to a further light source having a constant output.

11. The transconductance device according to claim 9, wherein the second photodiode is connected in series with the first photodiode and optically coupled to a further light source including a second laser diode driven by a constant current source.

12. The transconductance device according to claim 9, wherein:
   the input stage includes a differential amplifier having a pair of input transistors each driving a laser diode; and,
   the output stage includes a pair of photodiodes connected in series, each photodiode being optically coupled to one of the laser diodes, an output signal being taken from between the photodiodes.

13. The transconductance device according to claim 12, further comprising an output buffer stage connected between the photodiodes.

14. The transconductance device according to claim 12, further comprising an output buffer stage connected between the photodiodes, wherein the output buffer stage comprises a field effect transistor.

15. The transconductance device according to claim 9, further comprising:
   an opto-electronic inductor including a first non-inverting transconductor; and,
   a second inverting transconductor connected as an integrator with a grounded load and arranged in a back-to-back relationship with the first non-inverting transconductor.

16. The transconductance device according to claim 15, wherein the second transconductor is an FET transistor.

17. The transconductance device according to claim 9, wherein the transconductance device is a high frequency filter.

18. A transconductance device comprising:
   an input stage including at least one field effect transistor arranged to drive a laser diode;
   an output stage comprising a first photodiode optically coupled to the laser diode; and,
   a high impedance bias current supply circuit comprising a second photodiode connected in series with the first photodiode and optically coupled to a further light source having a constant output.

* * * * *